US010002816B2

(12) United States Patent
Matsuura et al.

(10) Patent No.: US 10,002,816 B2
(45) Date of Patent: Jun. 19, 2018

(54) ELECTRONIC DEVICE

(71) Applicant: MITSUBISHI HEAVY INDUSTRIES, LTD., Tokyo (JP)

(72) Inventors: Daisuke Matsuura, Tokyo (JP); Yoshikatsu Kuroda, Tokyo (JP); Kei Gemba, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 6 days.

(21) Appl. No.: 15/117,805

(22) PCT Filed: Mar. 18, 2015

(86) PCT No.: PCT/JP2015/058099
§ 371 (c)(1),
(2) Date: Aug. 10, 2016

(87) PCT Pub. No.: WO2015/141737
PCT Pub. Date: Sep. 24, 2015

(65) Prior Publication Data
US 2017/0011984 A1 Jan. 12, 2017

(30) Foreign Application Priority Data

Mar. 20, 2014 (JP) ................................. 2014-058801

(51) Int. Cl.
*H01L 23/367* (2006.01)
*H01L 23/38* (2006.01)
(Continued)

(52) U.S. Cl.
CPC .............. *H01L 23/367* (2013.01); *B64G 1/10* (2013.01); *B64G 1/50* (2013.01); *B64G 1/503* (2013.01);
(Continued)

(58) Field of Classification Search
CPC ..... H01L 23/367; H01L 23/34; H01L 27/092; H01L 23/38; B64G 1/58
(Continued)

(56) References Cited

U.S. PATENT DOCUMENTS 5,270,551 A  12/1993  Kamimura et al.
6,173,576 B1  1/2001  Ishida et al.
(Continued)

FOREIGN PATENT DOCUMENTS

JP  4-211158  8/1992
JP  2002-166898  6/2002
(Continued)

OTHER PUBLICATIONS

International Preliminary Report on Patentability dated Sep. 20, 2016 in corresponding International Application No. PCT/JP2015/058099.
(Continued)

*Primary Examiner* — Dion R Ferguson
*Assistant Examiner* — Mandeep S Buttar
(74) *Attorney, Agent, or Firm* — Wenderoth, Lind & Ponack, L.L.P.

(57) ABSTRACT

A semiconductor integrated circuit, a radiation detection unit and a cooling unit are provided. Here, a radiation detection unit is provided near the semiconductor integrated circuit and detects a radiation quantity. The cooling unit cools the semiconductor integrated circuit according to the detected radiation quantity. In an environment where a radiation quantity is more, the generation of a malfunction can be restrained by cooling the semiconductor integrated circuit.

6 Claims, 3 Drawing Sheets

(51) Int. Cl.
*H01L 27/092* (2006.01)
*G01T 1/24* (2006.01)
*B64G 1/10* (2006.01)
*B64G 1/58* (2006.01)
*G01J 5/00* (2006.01)
*B64G 1/50* (2006.01)
*B64G 1/54* (2006.01)
*F25B 21/02* (2006.01)
*H01L 23/34* (2006.01)

(52) U.S. Cl.
CPC ............... *B64G 1/546* (2013.01); *B64G 1/58* (2013.01); *G01J 5/0007* (2013.01); *G01T 1/244* (2013.01); *H01L 23/38* (2013.01); *H01L 27/092* (2013.01); *F25B 21/02* (2013.01); *F25B 2321/0212* (2013.01); *H01L 23/34* (2013.01); *H01L 2924/0002* (2013.01)

(58) Field of Classification Search
USPC ......... 361/718; 250/336.1, 310, 370, 370.15, 250/370.01; 378/44; 340/629
See application file for complete search history.

(56) References Cited

U.S. PATENT DOCUMENTS

| | | | | |
|---|---|---|---|---|
| 9,022,578 | B2* | 5/2015 | Nakanishi | G03B 21/16 348/747 |
| 2012/0132815 | A1* | 5/2012 | Frank | G01T 7/005 250/362 |

FOREIGN PATENT DOCUMENTS

| | | |
|---|---|---|
| JP | 2002-540632 | 11/2002 |
| JP | 2010-183087 | 8/2010 |
| WO | 00/59034 | 10/2000 |

OTHER PUBLICATIONS

International Search Report dated Jun. 2, 2015 in corresponding International Application No. PCT/JP2015/058099.
Extended European Search Report dated Mar. 24, 2017 in corresponding European Application No. 15765100.1.

\* cited by examiner

ELECTRONIC DEVICE

TECHNICAL FIELD

The present invention relates to an electronic device, and for example, the electronic device which contains a semiconductor device used in the environment exposed to the radiation.

BACKGROUND ART

It is known that a trouble, a malfunction and so on of a semiconductor integrated circuit are caused in the semiconductor integrated circuit used generally, when a charged particle having a relatively large energy hits to the semiconductor integrated circuit, resulting in occurrence of an important error.

As an example of such an error, SEL (Single Event Latchup), SEU (Single Event Upset), SET (Single Event Transient), and so on are known.

The cause of these errors is a charged particle and a radiation. Therefore, in an artificial satellite working in a space, a radiation camera and so on, it is necessary to constrain an error due to the radiation so that the built-in semiconductor integrated circuit works normally.

In conjunction with the above, an invention of a semiconductor circuit is disclosed in Patent Literature 1 (JP_2010-183087A). The semiconductor circuit specified in Patent Literature 1 is composed of a first circuit block and a second circuit block. Here, the first circuit block is formed for a plurality of PMOS transistors to be connected in serial or to be connected to a parallel circuit having one PMOS transistor. The second circuit block is formed for a plurality of NMOS transistors to be connected in serial or to be connected to a parallel circuit having one NMOS transistor. In the semiconductor circuit described in Patent Literature 1, a connection point between the first circuit block and the second circuit block is connected with an output terminal and the gates of all the PMOS transistors and the gates of all the NMOS transistors are connected to a common input terminal.

In case of Patent Literature 1, the redesigning of the semiconductor integrated circuit itself becomes necessary. Therefore, this technique is disadvantageous on both of a development period and a cost.

CITATION LIST

[Patent Literature 1] JP_2010-183087A

SUMMARY OF THE INVENTION

In the present invention, in an existing semiconductor integrated circuit, the tolerance to radiation is improved without changing the configuration. Other problems and new features will become clear from the description of this Specification and the attached drawings.

An electronic device according to an embodiment of the semiconductor integrated circuit, a radiation detection unit and a cooling unit. Here, the radiation detection unit is prepared near the semiconductor integrated circuit and detects a radiation quantity. The cooling unit cools the semiconductor integrated circuit according to the detected radiation quantity.

According to the one embodiment, in the environment having a more radiation quantity, by cooling the semiconductor integrated circuit, the generation of a malfunction can be more restrained. Also, because it adds the cooling unit and the radiation detection unit to an existing semiconductor integrated circuit, it is favorable in the aspect of a development period and a cost.

DESCRIPTION OF THE EMBODIMENTS

First, an important error which is caused in a semiconductor integrated device located under the environment exposed to radiation will be described.

Figure 1:
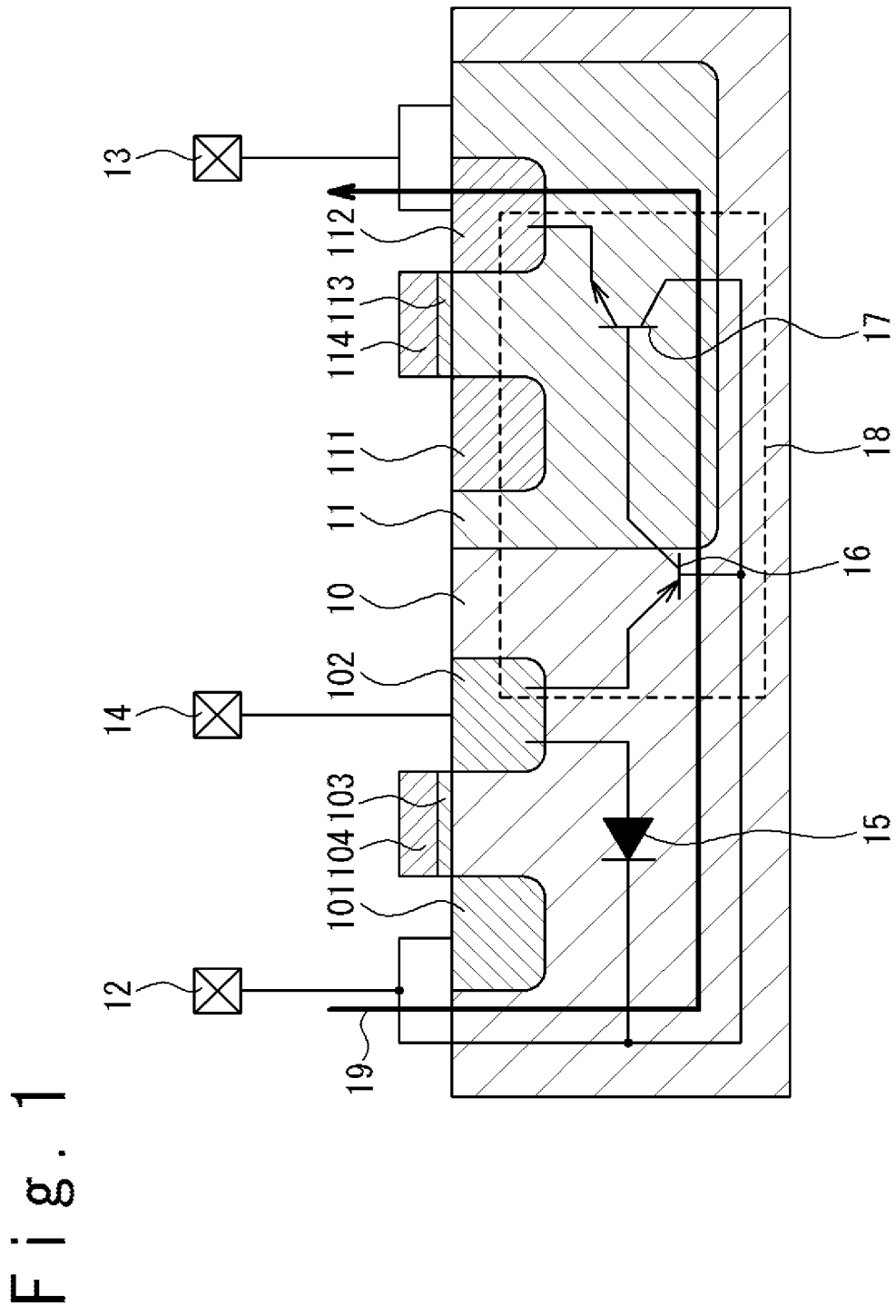
FIG. 1 is a sectional view showing a configuration example of the semiconductor integrated circuit and the principle of occurrence of SEL.

FIG. 1 is a sectional view showing a configuration example of a semiconductor integrated circuit and a principle of occurrence of SEL. The configuration of the semiconductor integrated circuit shown in FIG. 1 will be described.

The semiconductor integrated circuit shown in FIG. 1 has an N-type body region 10, a source 101, a drain 102, an oxide film 103 and a gate 104. These components work as a P-type MOS (Metal Oxide Semiconductor) FET (Field Effect Transistor). A power supply terminal 12 is connected with the source 101 to supply a power supply voltage VDD. A signal terminal 14 is connected with the drain 102 to supply a signal voltage Pin.

The semiconductor integrated circuit shown in FIG. 1 further has a P-type well 11, a drain 111, a source 112, an oxide film 113 and a gate 114. These components work as an N-type MOSFET. A ground terminal 13 is connected with the source 112 to supply a ground voltage VSS.

As in the semiconductor integrated circuit shown in FIG. 1, when the P-type MOSFET and the N-type MOSFET are formed to be adjacent to each other, a parasitic diode structure 15, parasitic bipolar transistor structures 16 and 17, a parasitic thyristor structure 18 and so on are formed, resulting in the operation of undesired functions.

In a configuration example shown in FIG. 1, a parasitic diode structure 15 exists in which the drain 102 functions as an anode and the N-type body region 10 functions as a cathode.

The parasitic bipolar transistor structure 16 exists, in which the drain 102 functions as a P-type emitter, the P-type well 11 functions as a P-type collector and the N-type body region 10 functions as an N-type base.

Another parasitic bipolar transistor structure 17 exists, in which the source 112 functions as an N-type emitter, the N-type body region 10 functions as an N-type collector and the P-type well 11 functions as a P-type base.

Moreover, the above-mentioned parasitic bipolar transistor structure 16 and the other parasitic bipolar transistor structure 17 are combined to produce the parasitic thyristor structure 18.

When a charged particle with a high energy is incident on such a semiconductor integrated circuit, current 19 flows. The current 19 enters the semiconductor integrated circuit from the power supply terminal 12 which applies the power supply voltage VDD to the N-type body region 10 and the source 101, passes through the N-type body region 10 and the P-type well 11, and goes out from the ground terminal 13 which applies a ground voltage VSS to the P-type well 11 and the source 112.

Because this current 19 flows through the parasitic thyristor structure 18, SEL occurs. The current 19 which accompanies SEL flows through an originally unintentional route, resulting in generation of an error in the operation of the semiconductor integrated circuit.

Figure 2:
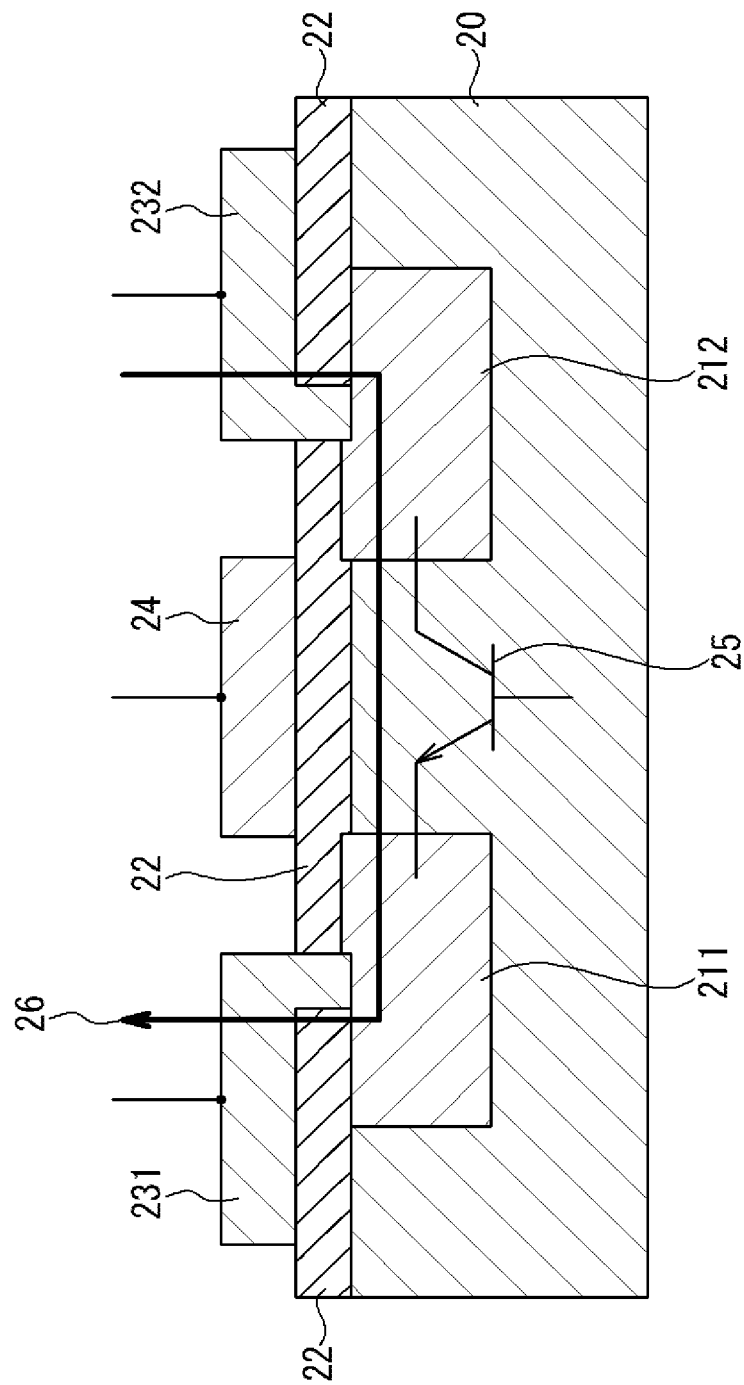
FIG. 2 is a sectional view showing another configuration example of the semiconductor integrated circuit and the principle of occurrence of SEL, SEU or SET.

FIG. 2 is a sectional view showing another configuration example of the semiconductor integrated circuit and a principle of occurrence of the SEU or SET. The structure of the semiconductor integrated circuit shown in FIG. 2 will be described.

The semiconductor integrated circuit shown in FIG. 2 has a P-type body region 20, two N-type wells 211 and 212, an insulating layer 22, a source 231, a drain 232 and a gate 24. These components operates as the N-type MOSFET.

In case of the semiconductor integrated circuit shown in FIG. 2, a parasitic bipolar transistor structure 25 exists in which one 211 of the two N-type wells functions as an N-type emitter, the other N-type well 212 functions as the N-type collector, and the P-type body region functions as the P-type base.

When a charged particle with a high energy is incident on such a semiconductor integrated circuit, a current 26 flows. The current 26 enters the semiconductor integrated circuit from the drain 232, passes through the N-type well 212, the P-type body region 20 and the N-type well 211, and goes out from the source 231.

Because this current 26 flows through the parasitic bipolar transistor structure 25, SEU and SET occur. When SEU is caused in the semiconductor integrated circuit which functions as a memory, a flip-flop and so on, the inversion of the stored data can be caused. Also, when SET occurs in the semiconductor integrated circuit which functions as a logic circuit and so on, an undesired current and voltage occurs like a pulse so that a malfunction can be caused.

In the present invention, the tolerance to radiation is improved by using the phenomenon that the resistance of the semiconductor body region decreases through cooling a semiconductor integrated circuit. That is, the current generated when the charged particle is incident to the semiconductor integrated circuit becomes easier to pass through the semiconductor body region if the resistance of the semiconductor body region falls more. As a result, the value of the current which flows through the parasitic thyristor structure and the parasitic bipolar transistor structure becomes smaller. Here, according to the present invention, note that the redesigning of the semiconductor integrated circuit itself is unnecessary.

Referring to the attached drawings, an embodiment to realize an electronic device according to the present invention will be described below.

(Embodiment)

Figure 3:
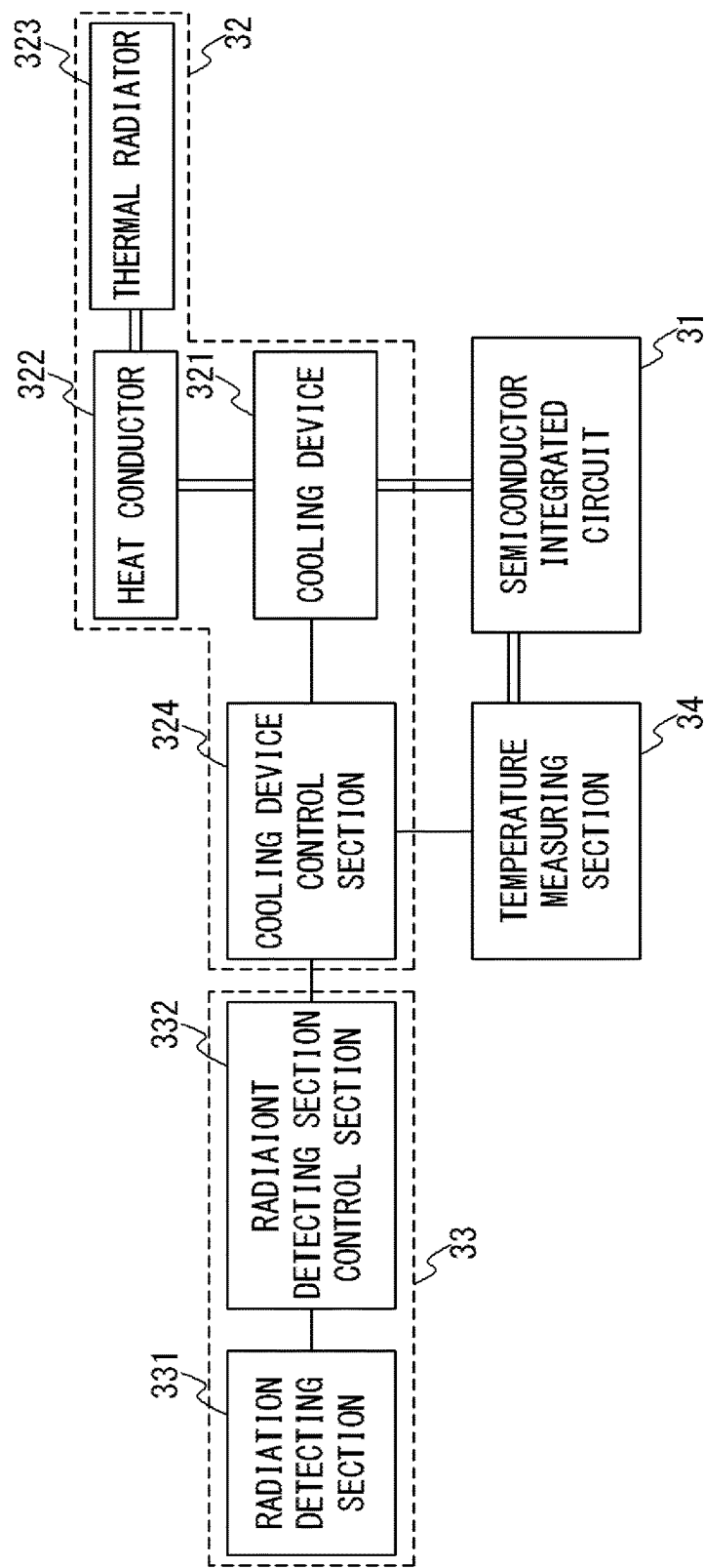
FIG. 3 is a block diagram schematically showing a configuration example of the electronic device according to the present invention.

FIG. 3 is a block diagram showing a configuration example of the electronic device according to the present invention. The configuration of the electronic device shown in FIG. 3 will be described.

The electronic device shown in FIG. 3 has a semiconductor integrated circuit 31, a cooling unit 32, a radiation detection unit 33 and a temperature measuring section 34. Here, as the semiconductor integrated circuit 31, an optional semiconductor integrated circuit is available.

The cooling unit 32 contains a cooling device 321, a heat conductor 322, a thermal radiator 323 and a cooling device control section 324. As an example, the cooling device 321 may be a Peltier device and so on, and thermal radiator 323 may be a heat sink, an outer wall of an artificial satellite and so on.

The radiation detection unit 33 contains a radiation detecting section 331 and a radiation detecting section control section 332.

The connection relation of the components shown in FIG. 3 will be described. Note that in FIG. 3, an electric connection is shown by a single line and a thermal connection is shown by a double line.

The semiconductor integrated circuit 31 and the cooling device 321 are thermally connected. The cooling device 321 and the heat conductor 322 are thermally connected. The heat conductor 322 and thermal radiator 323 are thermally connected. For example, when these thermal connections are established, it is desirable that the surface to be connected is brought into close contact through thermal grease, adhesive material and so on.

The semiconductor integrated circuit 31 and the temperature measuring section 34 are thermally connected. Here, the temperature measuring section 34 may be built in the semiconductor integrated circuit 31. Oppositely, when the temperature measuring section 34 is independent from the semiconductor integrated circuit 31, both of them may be brought into close contact, or the temperature measuring section 34 may be arranged in a position apart from the semiconductor integrated circuit 31 by a short distance. Moreover, one temperature measuring section 34 may be provided to a plurality of semiconductor integrated circuits 31. In any case, the temperature measuring section 34 is arranged in the position where the temperature of semiconductor integrated circuit 31 can be measured in a desired precision.

The output and input of the radiation detecting section 331 are electrically connected with the input and output of the radiation detecting section control unit 332, respectively. The other output and the other input of the radiation detecting section control unit 332 are electrically connected with the input and output of the cooling device control section 324, respectively. The other input of the cooling device control section 324 is electrically connected with the output of the temperature measuring section 34. The other output of the cooling device control section 324 is electrically connected with the input of the cooling device 321. Note that it is desirable for the radiation detecting section 331 to be arranged in a position which is near sufficiently from the semiconductor integrated circuit 31 so that the radiation detecting section 331 can detect a radiation quantity which influences the semiconductor integrated circuit 31 in a desired precision.

Each of the above-mentioned electric connections may be conducted with two wiring lines which are a combination of a signal line and a ground line. At this time, the heat conductor 322 and thermal radiator 323 may be used as a part of the ground line.

An operation of each component shown in FIG. 3 will be described.

The cooling device 321 is controlled by the cooling device control unit 324 to cool the semiconductor integrated circuit 31. The heat conductor 322 transfers a heat quantity generated with this cooling from the cooling device 321 to thermal radiator 323. The thermal radiator 323 radiates the heat quantity transferred from the heat conductor 322 toward the outside.

The radiation detecting section 331 is controlled by the radiation detecting section control section 332 to detect a radiation quantity. The radiation detecting section 331 generates a signal indicating a detection result of the radiation quantity to transmit to the cooling device control section 324 through the radiation detecting section control section 332. Note that the signal indicating the detection result of the radiation quantity may be directly communicated from the radiation detecting section 331 to the cooling device control section 324.

The temperature measuring section 34 measures a temperature of the semiconductor integrated circuit 31 itself or around it. The temperature measuring section 34 generates a signal indicting the measurement result of temperature toward the cooling device control section 324.

The operations of the cooling device control section 324 and the radiation detecting section control section 332 will be described in detail. When the electronic device according to the present invention is the above-mentioned artificial satellite as an example, it is necessary to control the power consumption so as to save it as much as possible. Especially, the Peltier device consumes much power to move a heat quantity from a cooling surface to a hot surface. Also, the power is consumed for the detection of the radiation quantity.

Therefore, the cooling device control section 324 may control a cooling ability of the cooling device 321 based on a combination of the detected radiation quantity and the measured temperature. Also, the cooling device control section 324 may carry out the control operation of the cooling device 321 when the detected radiation quantity is higher than a predetermined threshold value, when the detected temperature is higher than a predetermined threshold value, or when the above two conditions are met. It is desirable that these operation conditions and specific threshold values can be set or changed appropriately according to the importance of the operation to be carried out by the semiconductor integrated circuit 31.

Also, the radiation detecting section control section 332 may control the radiation detecting section 331 to regularly detect the radiation quantity and may control it to detect the radiation only when the measured temperature is higher than the predetermined threshold value.

In this way, in the present invention, the tolerance to the radiation is improved by using the phenomenon that the resistance of the body region of the semiconductor integrated circuit falls without any alteration of the configuration of the existing semiconductor integrated circuit as the semiconductor integrated circuit is cooled. Moreover, by controlling the detection of the radiation quantity and the appropriately controlling to cool the semiconductor integrated circuit, the power consumed through these operations can be saved.

Also, as a further application of this embodiment, a kit may be prepared which has components of the electronic device shown in FIG. 3 except for the semiconductor integrated circuit 31. If such a kit is loaded such that the cooling device 321 is brought into close contact to the surface of an existing semiconductor integrated circuit, the tolerance to radiation in the existing semiconductor integrated circuit can be improved.

The embodiments of the invention made by the inventors have been described. However, the present invention is not limited to the embodiments and various modifications are possible in a range without deviating from features of the present invention. Also, the features described in the embodiments may be combined in a range without contradicting technically.

EXPLANATION OF REFERENCE NUMERALS AND SYMBOLS

10 N-type body region
101 source
102 drain
103 oxide film
104 gates
11 P-type well
111 drain
112 source
113 oxide film
114 gate
12 power supply terminal
13 ground terminal
14 signal terminal
15 parasitic diode structure
16 parasitic transistor structure
17 parasitic transistor structure
18 parasitic thyristor structure
19 SEL current
20 P-type body region
211 N-type well
212 N-type well
22 insulating layer
231 source
232 drain
24 gate
25 parasitic bipolar transistor structure
26 SEU current, SEU current
31 semiconductor integrated circuit
32 cooling unit
321 cooling device
322 heat conductor
323 thermal radiator
324 cooling device control section
33 radiation detection unit
331 radiation detecting section
332 radiation detecting section control section
34 temperature measuring section

The invention claimed is:

1. An electronic device comprising:
a semiconductor integrated circuit;
a temperature measuring section configured to measure a temperature of the semiconductor integrated circuit;
a radiation detection unit provided near the semiconductor integrated circuit to detect a radiation quantity when the measured temperature is equal to or higher than a predetermined value; and
a cooling unit configured to cool the semiconductor integrated circuit based on the detected radiation quantity, wherein the cooling unit comprises:
a cooling device thermally connected with the semiconductor integrated circuit to absorb a heat quantity from the semiconductor integrated circuit;
a heat conductor thermally connected with the cooling device to conduct the absorbed heat quantity;
a thermal radiator thermally connected with the heat conductor to radiate the conducted heat quantity toward outside.

2. The electronic device according to claim 1, wherein the cooling unit further comprises:
a cooling device control section configured to control an operation of the cooling device such that the measured temperature falls within a predetermined range.

3. The electronic device according to claim 2, wherein the radiation detection unit comprises:

a radiation detecting section configured to detect the radiation quantity; and a radiation detecting section control section configured to control an operation of the radiation detecting section and generate a signal indicating the detected radiation quantity to transmit to the cooling device control section.

4. A kit comprising:

a temperature measuring section configured to measure a temperature of a semiconductor integrated circuit;

a radiation detection unit provided near the semiconductor integrated circuit to detect a radiation quantity when the measured temperature is equal to or higher than a predetermined value; and a cooling unit attached to the semiconductor integrated circuit so as to be brought into close contact with the semiconductor integrated circuit and configured to cool the semiconductor integrated circuit based on the detected radiation quantity, wherein the cooling unit comprises:

a cooling device thermally connected with the semiconductor integrated circuit to absorb a heat quantity from the semiconductor integrated circuit;

a heat conductor thermally connected with the cooling unit to conduct the absorbed heat quantity; and a thermal radiator thermally connected with the heat conductor to radiate the conducted heat quantity toward outside.

5. The kit according to claim 4, wherein the cooling unit further comprises:

a cooling device control section configured to control an operation of the cooling unit such that the measured temperature falls within a predetermined range.

6. The kit according to claim 5, wherein the radiation detection unit comprises:

a radiation detecting section configured to detect a radiation quantity; and a radiation detecting section control section configured to control an operation of the radiation detecting section and to generate a signal indicating the detected radiation quantity to transmit to the cooling device control section.

\* \* \* \* \*